United States Patent [19]
Uraguchi et al.

[11] Patent Number: 5,571,644
[45] Date of Patent: Nov. 5, 1996

[54] METHOD AND APPARATUS FOR DEVELOPING RESIST

[75] Inventors: Masahiro Uraguchi; Yusei Miyazono; Kazuhiko Sumi, all of Kawasaki, Japan

[73] Assignee: Fujitsu Limited, Kawasaki, Japan

[21] Appl. No.: 497,886

[22] Filed: Jul. 3, 1995

Related U.S. Application Data

[63] Continuation of Ser. No. 110,931, Aug. 24, 1993, abandoned.

[30] Foreign Application Priority Data

Aug. 28, 1992 [JP] Japan .................................... 4-230159

[51] Int. Cl.⁶ .................................................. G03F 7/30
[52] U.S. Cl. .......................... 430/30; 430/325; 430/326; 430/311; 430/331; 396/571; 396/626
[58] Field of Search .............................. 430/30, 325, 326, 430/311, 331; 354/299, 324

[56] References Cited

U.S. PATENT DOCUMENTS 4,982,215   1/1991   Matsuoka ................................ 354/299

FOREIGN PATENT DOCUMENTS 2248956   10/1990   Japan .................................... 430/331
5-181286   7/1993   Japan .................................... 430/325

Primary Examiner—Cynthia Hamilton
Attorney, Agent, or Firm—Staas & Halsey

[57] ABSTRACT

A resist developing apparatus has a plurality of developing solution containers each provided with a temperature regulator, a mixture tank connected to the plurality of developing solution containers, a flow control valve connected between the mixture tank and each developing solution container, a temperature detector for detecting the temperature of developing solution in the mixture tank, and a control system for controlling the flow control valve in accordance with the temperature detected by the temperature detector. As the development progresses, the temperature of the developing solution is lowered to stop the development. Thereafter, the developing solution is supplanted by rinsing solution.

6 Claims, 1 Drawing Sheet

METHOD AND APPARATUS FOR DEVELOPING RESIST

This application is a continuation of application Ser. No. 08/110,931, filed Aug. 24, 1993, now abandoned.

BACKGROUND OF THE INVENTION a) Field of the Invention

The present invention relates to a technique for developing resist at high precision.

b) Description of the Related Art

Forming a resist pattern at high precision has long been desired as semiconductor integrated circuits have become highly integrated. In this specification, a term "resist" collectively means any resist sensitive to energy beams, such as photoresist and electron beam (EB) resist.

Positive type resist and negative type resist Bare known. Of the positive type resist, the region where an energy beam such as a light beam and electron beam was applied is removed. Of the negative type resist, the region where an energy beam was riot applied is removed.

EB resist of high resolution will be explained illustratively. Generally used as EB resist are styrene based or methacrylic acid based positive resist, and styrene based negative resist. EB resist is generally coated by a spinner on the surface of an underlie such as a reticle quartz substrate and a Si substrate, and exposed by an electron beam.

An EB resist film after being exposed undergoes a development process. This development process generally includes:

(1) development process, (2) a rinse process, and (3) a dry process.

In the development process, an EB resist film is selectively dissolved by organic solvent by a chemical property difference between the exposed region and unexposed region off the EB resist film. Developing solution not only selectively dissolves the exposed region or unexposed region, but also swells the unremoved EB resist film.

In the rinse process, the developing solution is supplanted by rinsing solution. The rinse process has a function of tightening and condensing the resist film swelled by the developing solution as well as the function of stopping the development. As the rinsing solution for EB resist, organic solvent having a lower resist solubility than developing solution is generally used.

For example, for positive type EB resist, there are used a mixed solution of methylethylketone and methylisobutylketone as the developing solution and a mixed solution of isopropylalcohol and methylisobutylketone as the rinsing solution. For negative type EB resist, there are used a mixed solution of isoamylacetate and ethylene glycol monoethyl ether as the developing solution and ethylene glycol monoethyl ether as the rinsing solution.

After the development is stopped and the original condensed state of the swelled resist film is recovered, the resist film is dried to complete the developing program.

A new defect has been found recently during a resist development process. Namely, precipitate as thick as 1 μm is left in a hole formed by the development process. This phenomenon Is conspicuous particularly in the case of positive type resist. The cause of generating such a defect may be reasoned from the following.

In the development process, resist is dissolved into developing solution. Developing solution has a high solubility relative to resist. Positive type EB resist after the development process reduces its thickness, and the ratio of a finished film thickness to the original film thickness is only about 90%. The solubility of negative type EB resist into developing solution is lower than that of positive type EB resist. However, the ratio is in the order not negligible.

During the transition period from the development process to the rinse process, the developing solution and rinsing solution contact each other and are mixed together. Part of the resist components dissolved greatly in the developing solution is immersed in the rinsing solution and is deposited as precipitate again on the surface of the underlie, because of a low solubility of the rinsing solution.

For example, if precipitate having a diameter of about 1 μm is deposited in a window formed in a reticle, a defect of about 0.2 μm is formed on a subject exposed at a reduction ratio of ⅕. This defect of about 0.2 μm is fatal to a highly integrated semiconductor device.

Such a defect is formed not only on negative type resist but also on positive type resist, and not only on EB resist but also on photoresist.

A defect caused by resist re-deposition is formed due to a solubility difference between developing solution and rinsing solution. In order to relieve an abrupt change in the solubility, it is conceivable that a plurality of rinsing solutions or a plurality of mixed solutions of developing and rinsing solutions at different compositions are prepared to transit form the developing process to the rinse process while gradually changing the resist solubility.

As described above, a surface defect by resist re-deposition on the reticle surface is caused by a solubility difference between developing and rinsing solutions.

SUMMARY OF THE INVENTION

It is an object of the present invention to provide a novel resist developing technique.

It is another object of the present invention to provide a resist developing technique capable of preventing dissolved resist from being re-deposited on the surface of an underlie.

According to one aspect of the present invention, there is provided a resist developing apparatus having a plurality of developing solution containers each provided with a temperature regulator, a mixture tank connected to the plurality of developing solution containers, a flow control valve connected between the mixture tank and each developing solution container, a temperature detector for detecting the temperature of developing solution in the mixture tank, and a control system for controlling the flow control valve in accordance with the temperature detected by the temperature detector.

According to another aspect of the present invention, there is provided a resist developing method including the steps of preparing developing solutions having different temperatures in different containers, mixing the developing solutions having different temperatures to make mixed developing solution having a predetermined temperature, and developing resist by using the mixed developing solution having the predetermined temperature.

Developing solutions are contained in a plurality of developing solution containers and set to different temperatures. The developing solutions having different temperatures are mixed together in the mixture tank to obtain developing solution having a predetermined temperature. By changing the temperature during the development process, various types of development processes are possible.

For example, if developing solution at a low temperature is used, the resist profile can be improved. If developing solution at a high temperature is used, the time required for the development process can be shortened.

The development is performed at predetermined speeds using developing solution whose temperature is changed with time. As the temperature of the developing solution is gradually lowered, the resist solubility of the developing solution gradually lowers. When the resist solubility of the developing solution becomes sufficiently low, the development is substantially stopped.

With such a temperature change, it is possible to stop the development without supplanting the developing solution by rinsing solution. After the resist solubility of the developing solution becomes sufficiently low, the developing solution is supplanted by rinsing solution so that resist dissolved in the developing solution can be prevented from re-deposition.

The development is stopped not by supplanting the developing solution by the rinsing solution, but by the temperature change of the development solution. The function of tightening the swelled resist film is provided by the rinsing solution as conventional.

DETAILED DESCRIPTION OF THE PREFERRED EMBODIMENTS

Figure 1:
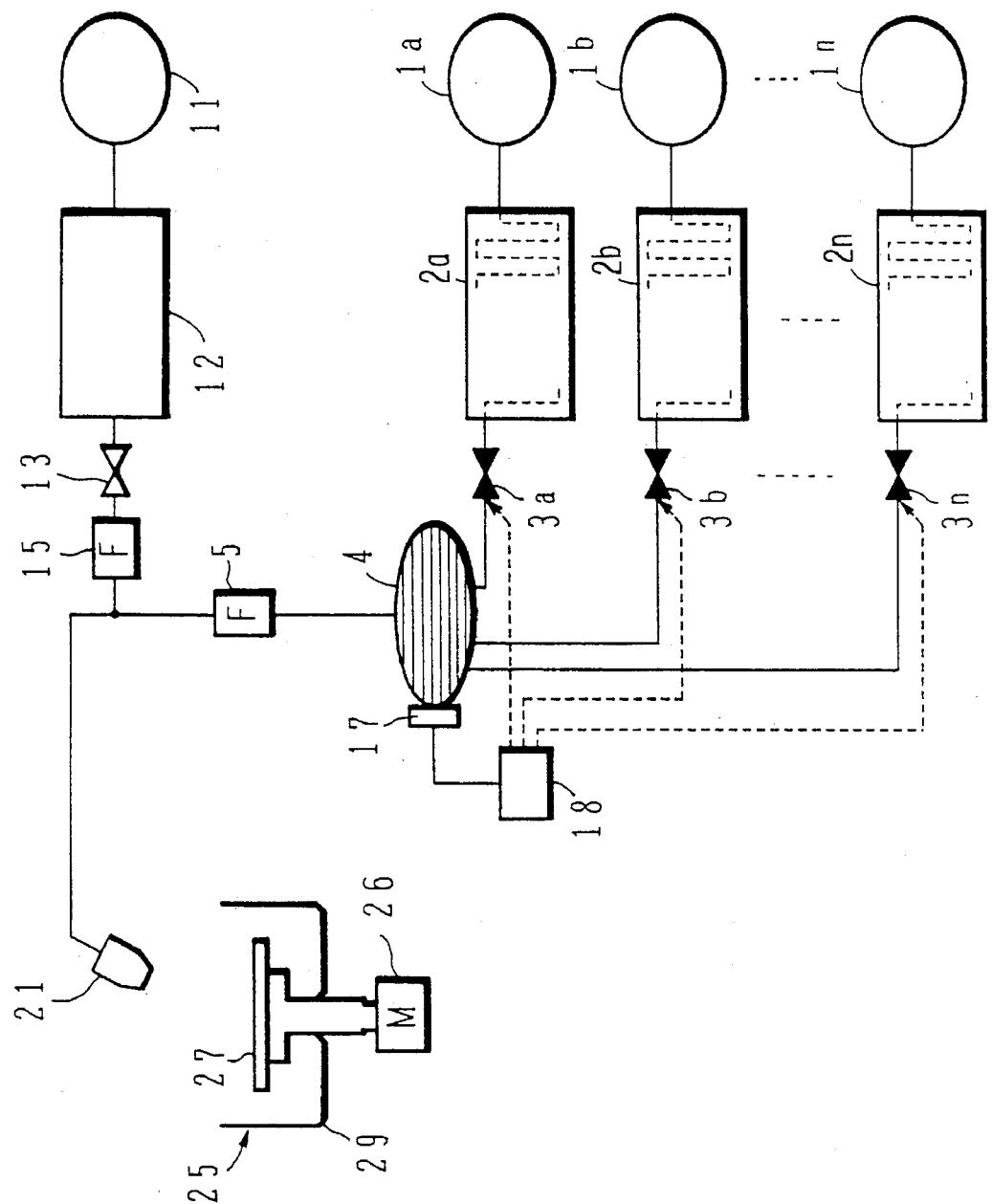
FIG. 1 is a block diagram showing a resist developing apparatus according to an embodiment of the present invention.

Referring to FIG. 1 showing a resist developing apparatus according to an embodiment of the invention, canister tanks 1a and 1b contain the same kind of developing solutions, such as a mixed solution of isoamylacetate and ethylene glycol monoethyl ether.

Pipes are connected between the canister tanks and constant temperature baths 2a and 2b whereat the temperatures of the solutions are maintained constant. The solutions are introduced via control valves 3a and 3b into a mixture tank 4 wherein the solutions are mixed together. Each constant temperature bath 2 can be set to a desired temperature, for example, within a range from about 10° to 25 ° C. For example, the constant temperature bath 2a is set to 10° C., and the constant temperature bath 2b is set to 25° C.

The mixture ratio of developing solutions in the mixture tank 4 can be controlled by the control valves 3a and 3b. The developing solution to be supplied from the mixture tank 4 can be set to a desired temperature within a range from about 10° to 25° C. for example.

Other lines are also connected to the mixture tank 4. For example, a line including a canister tank 1n, constant temperature bath 2n, and control valve 3n is connected to the mixture tank 4. These lines are used for supplying the same kind of developing solutions at different temperatures or different kinds of developing solutions. A purge line may be installed. A control valve may be provided downstream of the mixture tank 4.

An output line of the mixture tank 4 is connected via a filter 5 to a spray tip 21. A tap nozzle may be used in place of the spray tip. Another line including a canister tank 11 containing rinsing solution, constant temperature bath 12, control valve 13, and filter 15, is also connected to the spray tip 21. Another pipe line and another spray tip or tap nozzle may be used solely for the rinsing solution.

A temperature detector 17 is set to the mixture tank 4 to measure the temperature of the developing solution in the tank 4 in a contact or non-contact manner. The detected temperature in the form of electrical signal is supplied to a controller 18 which generates signals for controlling the control valves 3.

Specifically, in the above example, if the temperature of the developing solution to be supplied at a temperature T rises, the controller 18 controls the low temperature side control valve 3a toward the open direction and the high temperature side control valve 3b toward the close direction.

A spinner 25 is placed under the spray tip 21. The spinner 25 has a plate 27 coupled to the drive shaft of a motor 26 and a cup 29 surrounding the plate 27.

In the above description, two kinds of developing solutions at different temperatures and of the same component are used. Three or more kinds of developing solutions at different temperatures may be used. The precision of temperature control can be improved if the temperatures at both the constant temperature baths 2a and 2b are set so that the temperature of the developing solution in the mixture tank 4 changes less with a change in the mixture ratio. Developing solutions of different compositions may be used if the solubilities relative to resist are not so different.

With the developing apparatus described above, the developing process can be performed using developing solution set to a predetermined temperature. For example, the developing solution is set to a low temperature and the development process is executed slowly to obtain a high precision profile, or the developing solution is set to a high temperature to execute the development process at high speed.

The controller 18 may include a timer, memory, comparator, and the like to represent the temperature profile of the development process as the function of time to make the development process have a temperature change with time. For example, most of the development process is carried out at a predetermined constant temperature, and thereafter the temperature of the developing solution is gradually lowered proportionally with the lapse of time measured by the timer until the development is stopped by the lowered temperature of the developing solution.

The temperature detector 17 measures the temperature of the developing solution in the mixture tank 4. The controller 18 compares the measured temperature with the setting temperature, and if both the temperatures are different, regulates the control valve 3 to change the mixture ratio and make both the temperatures become the same.

A plurality of lines for supplying developing solutions of the same composition kept at successively decreasing temperature may be used so that the temperature of the final developing solution can be gradually and stepwisely changed at the final stage of the developing process.

After the development ceases at the lowered temperature of the developing solution sprayed from the spray tip 21, time supply of the developing solution is stopped and the rinsing solution in the canister tank 11 is supplied to the same spray tip 21. The supply of the rinsing solution supplants time developing solution, and tighten the swelled resist to recover the original condition.

Valves may be provided upstream of the junction of the developing solution supply line and rinsing solution supply line. The spray chip may be replaced by a tap nozzle.

In the above description, the temperature of the developing solution is set to an optional value within the range from 10° to 25° C. The temperature range is not limited to this range. If the temperature of the developing solution is required to be set to near that of a clean room which is generally controlled at a temperature of 22° C., it is preferable to set the temperature of developing solution, if using organic solvent, to about 25° C. because the solution temperature is lowered by its heat of vaporization.

Developing solution higher than 25° C. may also be used to develop at high speed. If developing solution unable to stop the development at 10° C. is to be used, the temperature range is extended further to the lower temperature side.

In addition to a rinsing solution line, a pure water line and the like may be added to the apparatus.

In the above description, the temperature of the developing solution in the mixture tank 4 is detected and the controller 18 controls the mixture ratio of the developing solution to have a predetermined temperature. Instead, the resist under the development may be monitored so that the monitor output signal is supplied to the controller 18 to control the development process.

In developing resist at high resolution, the temperature of the developing solution is gradually lowered until the development is stopped. In this manner, resist once dissolved in the developing solution can be prevented from being re-deposited on the reticle surface. Accordingly, it is possible to eliminate defective reticles to be caused by resist re-deposition and to manufacture reticles of high precision at high yield.

The present invention has been described in connection with the above embodiments. The invention is not intended to be limited only to the embodiments, but it is apparent for those skilled in the art that various substitutions, changes, improvements, combinations, and the like are possible.

We claim:

1. A resist developing method for developing a resist film sensitive to an energy beam and which has been selectively exposed to the energy beam so that the resist film has exposed and unexposed regions, said method comprising the steps of:

preparing developing solutions having different temperatures in different containers, either said exposed regions of the resist film or alternatively said unexposed regions of the resist film having a solubility in the developing solutions which is reduced as the temperature of the developing solution is lowered;

mixing said developing solutions having different temperatures at a mixture ratio to provide a mixed developing solution having a predetermined temperature;

subsequent to said mixing step, applying said mixed developing solution having said predetermined temperature to the resist film to thereby remove either the exposed regions of the resist film or the unexposed regions of the resist film;

further mixing said developing solutions having different temperatures, while changing the mixture ratio of said developing solutions as the development proceeds to thereby gradually lower the temperature of the mixed developing solution; and further applying said mixed developing solution having the gradually lowered temperature to said resist film.

2. A resist developing method according to claim 1, further comprising the step of measuring the temperature of said mixed developing solution during said step of mixing the developing solutions, and if said measured temperature is different from said predetermined temperature, changing the mixture ratio of said mixed developing solution so as to bring the temperature of the mixed developing solution to said predetermined temperature.

3. A resist developing method according to claim 2, wherein said temperature of the mixed developing solution during said mixing step and during said further mixing step is within a range from about 25° C. to about 10° C.

4. A resist developing method for developing a resist film sensitive to an energy beam and which has been selectively exposed to the energy beam so that the resist film has exposed and unexposed regions, said method comprising the steps of:

preparing first and second developing solutions having different temperatures in different containers, either said exposed regions of the resist film or alternatively said unexposed regions of the resist film having a solubility in the developing solutions which is reduced as the temperature of the developing solution is lowered;

mixing said first and second developing solutions having different temperatures at a mixture ratio to provide a mixed developing solution;

subsequent to said mixing step, applying said mixed developing solution to the resist film to thereby remove either the exposed regions of the resist film or the unexposed regions of the resist film and thereby develop the resist film;

holding said mixture ratio of said developing solutions constant during a first developing period to thereby maintain said mixed developing solution at a constant temperature during said first developing period; and thereafter continually changing the mixture ratio of said developing solutions having different temperatures during a second developing period in such a manner that the temperature of the mixed developing solution is gradually lowered during said second developing period.

5. A resist developing method according to claim 4, wherein said temperature of the mixed developing solution is lowered stepwise during said second period.

6. A resist developing method according to claim 4, wherein the mixture ratio of said first and second developing solutions is continually changed during said second period to thereby gradually lower the temperature of the mixed development solution until such time as the development of the resist is discontinued.

* * * * *

UNITED STATES PATENT AND TRADEMARK OFFICE
CERTIFICATE OF CORRECTION

PATENT NO.  : 5,571,644
DATED       : Nov. 5, 1996
INVENTOR(S) : Uraguchi, et al It is certified that error appears in the above-indentified patent and that said Letters Patent is hereby corrected as shown below:

Column 5, line 4, delete "22" and substitute --23--.

Signed and Sealed this

Twenty-fifth Day of February, 1997

Attest:

BRUCE LEHMAN

*Attesting Officer*  *Commissioner of Patents and Trademarks*